(12) United States Patent
Wang et al.

(10) Patent No.: US 11,855,632 B2
(45) Date of Patent: *Dec. 26, 2023

(54) LOGIC CELL STRUCTURE AND INTEGRATED CIRCUIT WITH THE LOGIC CELL STRUCTURE

(71) Applicant: TAIWAN SEMICONDUCTOR MANUFACTURING COMPANY LTD., Hsinchu (TW)

(72) Inventors: Shao-Huan Wang, Taichung (TW); Chun-Chen Chen, Hsinchu County (TW); Sheng-Hsiung Chen, Hsinchu County (TW); Kuo-Nan Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 102 days.

This patent is subject to a terminal disclaimer.

(21) Appl. No.: 17/115,571

(22) Filed: Dec. 8, 2020

(65) Prior Publication Data

US 2021/0091769 A1   Mar. 25, 2021

Related U.S. Application Data

(63) Continuation of application No. 16/525,311, filed on Jul. 29, 2019, now Pat. No. 10,868,538.

(51) Int. Cl.
*H03K 19/17704* (2020.01)
*H01L 23/528* (2006.01)
(Continued)

(52) U.S. Cl.
CPC ..... *H03K 19/17704* (2013.01); *G06F 30/392* (2020.01); *H01L 23/528* (2013.01); *H01L 27/0207* (2013.01); *H03K 19/17736* (2013.01)

(58) Field of Classification Search
CPC ........ H03K 19/17704; H03K 19/17736; G06F 30/392; G06F 2115/06; H01L 23/528; H01L 27/0207
See application file for complete search history.

(56) References Cited

U.S. PATENT DOCUMENTS 8,357,955 B2 * 1/2013 Tanaka ................ H01L 27/0207
                                                  326/103
8,446,176 B1 * 5/2013 Yang ....................... G06F 30/39
                                                  326/103
(Continued)

*Primary Examiner* — Seokjin Kim
(74) *Attorney, Agent, or Firm* — WPAT LAW; Anthony King

(57) ABSTRACT

A logic cell structure includes a first portion, a second portion and a third portion. The first portion, arranged to be a first layout of a first semiconductor element, is placed in a first cell row of a substrate area extending in a first direction. The second portion, arranged to be a second layout of a second semiconductor element, is placed in a second cell row of the substrate area. The third portion is arranged to be a third layout of an interconnecting path used for coupling the first semiconductor element and the second semiconductor element. The first, second and third portions are bounded by a bounding box with a height in a second direction and a width in the first direction. Respective centers of the first portion and the second portion are arranged in a third direction different from each of the first direction and the second direction.

20 Claims, 11 Drawing Sheets

(51) Int. Cl.
*H03K 19/17736* (2020.01)
*H01L 27/02* (2006.01)
*G06F 30/392* (2020.01)

(56) References Cited

U.S. PATENT DOCUMENTS

| | | | | |
|---|---|---|---|---|
| 2003/0178648 | A1* | 9/2003 | Bansal | H01L 27/11807 |
| | | | | 257/202 |
| 2007/0290270 | A1* | 12/2007 | Ko | H01L 27/0207 |
| | | | | 257/369 |
| 2010/0123481 | A1* | 5/2010 | Ogata | H01L 27/0207 |
| | | | | 326/101 |
| 2010/0270600 | A1* | 10/2010 | Inukai | G06F 30/392 |
| | | | | 716/132 |
| 2010/0289111 | A1* | 11/2010 | Lee | G06F 30/392 |
| | | | | 257/E23.179 |
| 2014/0167815 | A1* | 6/2014 | Penzes | G06F 30/392 |
| | | | | 438/129 |
| 2014/0183646 | A1* | 7/2014 | Hatamian | G06F 30/398 |
| | | | | 716/112 |
| 2019/0355749 | A1* | 11/2019 | Do | H01L 27/11807 |

* cited by examiner

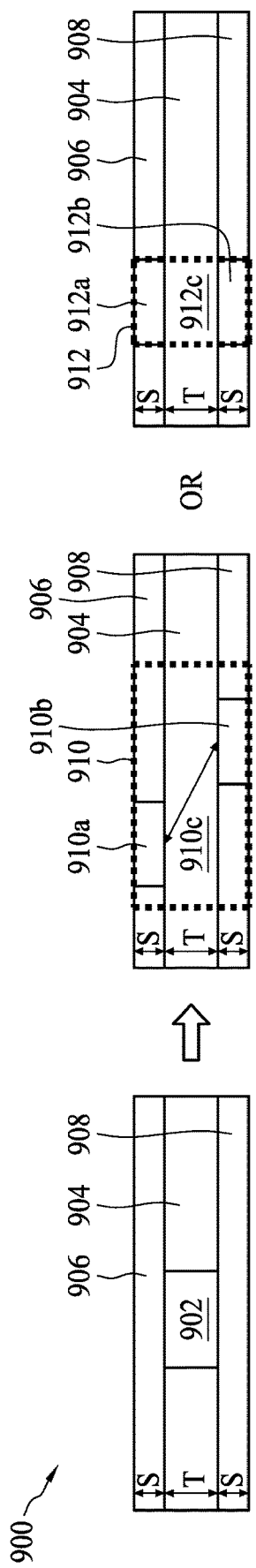
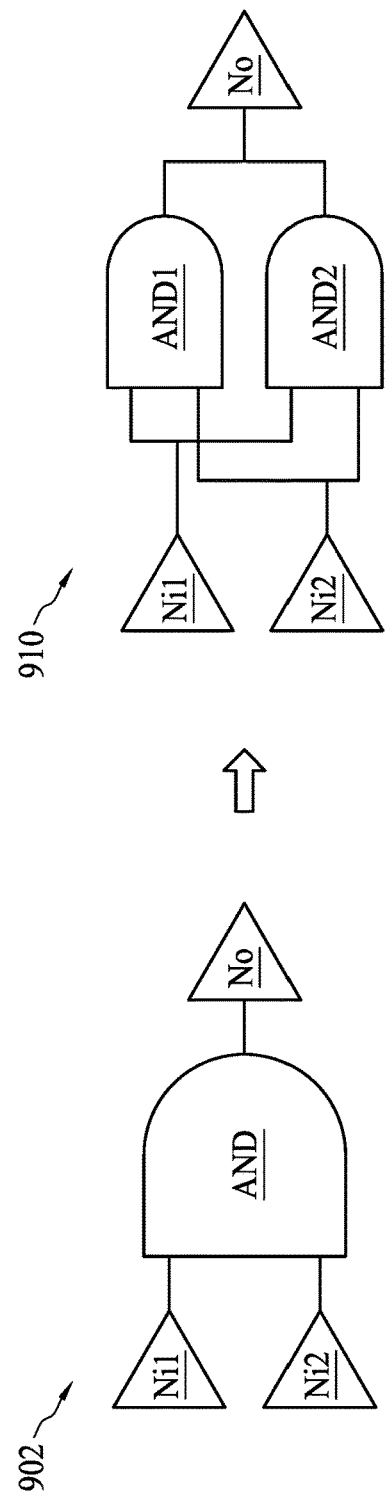
FIG. 9A  FIG. 9B  FIG. 9C  FIG. 9D  FIG. 9E

LOGIC CELL STRUCTURE AND INTEGRATED CIRCUIT WITH THE LOGIC CELL STRUCTURE

PRIORITY CLAIM AND CROSS-REFERENCE

The present application is a continuation application of U.S. patent application Ser. No. 16/525,311 filed on Jul. 29, 2019, which is incorporated herein by reference in its entirety.

BACKGROUND

Typically, in the design of integrated circuits, standard cells having fixed functions are pre-designed. The pre-designed standard cells are stored in cell libraries. When designing integrated circuits, the standard cells are retrieved from the cell libraries and placed into desired locations on an integrated circuit layout. During the cell placement, the unit-row height layout system or the mixed-row heights system may be used. However, it is very challenging for the designer to balance the cell delay and the placement density of logic cells in the unit-row height layout system or the mixed-row heights system. Therefore, a novel architecture of logic cell for improving the cell placement problem in the layout system is highly desirable in the field of IC (Integrated circuit) design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A is a diagram illustrating of a logic cell placed in a mixed-row heights layout system in accordance with some embodiments.

FIG. 9B is a diagram illustrating of a logic cell placed in the mixed-row heights layout system in accordance with some embodiments.

FIG. 9C is a diagram illustrating of a logic cell placed in the mixed-row heights layout system in accordance with some embodiments.

FIG. 9D is a diagram illustrating a schematic circuit of a logic cell in accordance with some embodiments.

FIG. 9E is a diagram illustrating a schematic circuit of a logic cell in accordance with some embodiments.

DETAILED DESCRIPTION

Figure 1:
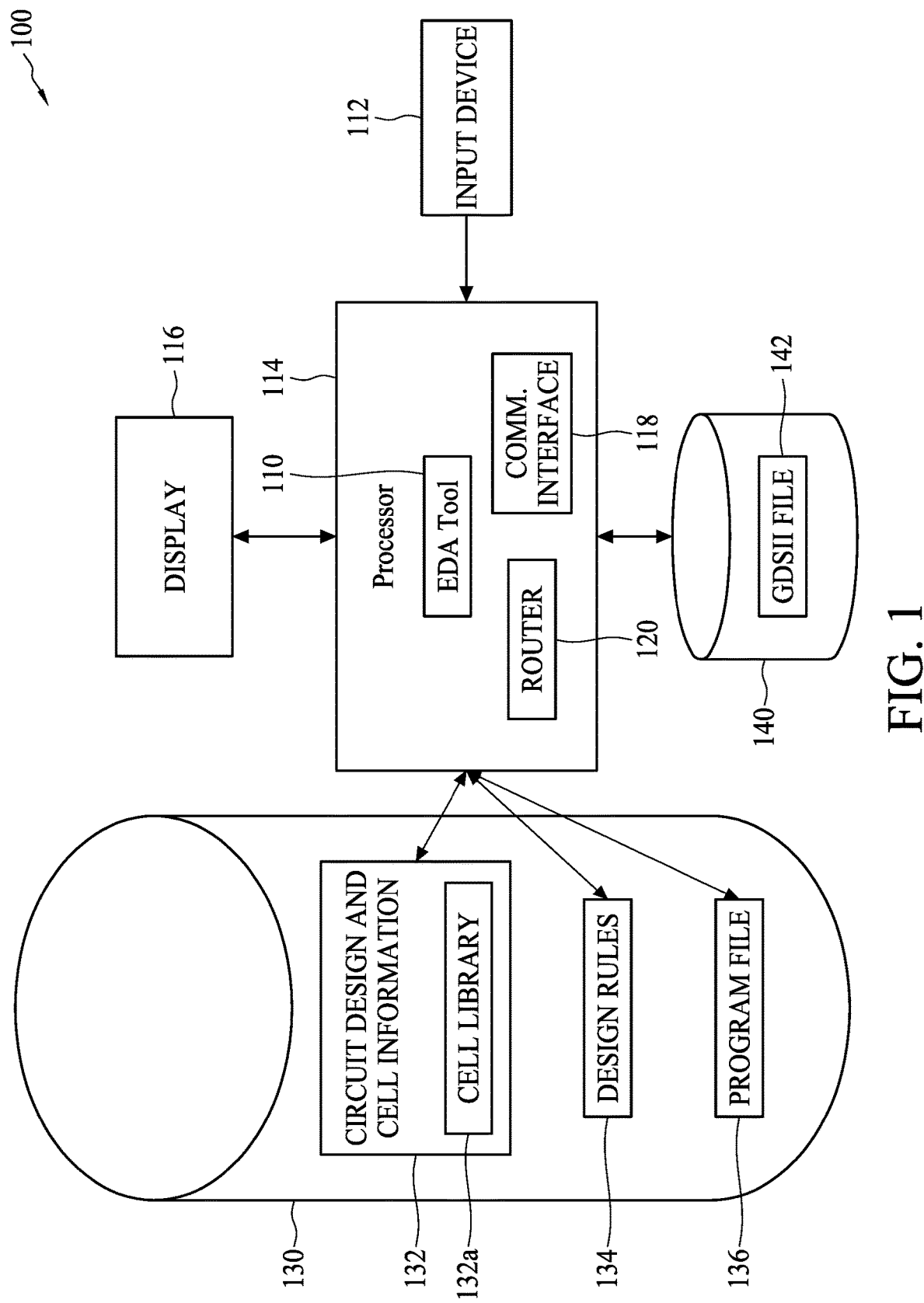
FIG. 1 is a diagram illustrating an electronic design automation system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram illustrating an electronic design automation system 100 in accordance with some embodiments. As shown in FIG. 1, system 100 includes an electronic design automation ("EDA") tool 110 having a place and route tool including a chip assembly router 120.

The EDA tool 110 is a special purpose computer formed by retrieving stored program instructions 136 from a computer readable storage medium 130, 140 and executing the instructions on a general purpose processor 114. Processor 114 may be any central processing unit ("CPU"), microprocessor, micro-controller, or computational device or circuit for executing instructions. The non-transitory machine readable storage medium 130, 140 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 100 may include a display 116 and a user interface or input device 112 such as, for example, a mouse, a touch screen, a microphone, a trackball, a keyboard, or other device through which a user may input design and layout instructions to system 100. The one or more computer readable storage mediums 130, 140 may store data input by a user such as a circuit design and cell information 132, which may include a cell library 132 a, design rules 134, one or more program files 136, and one or more graphical data system ("GDS") II files 142.

EDA tool 110 may also include a communication interface 118 allowing software and data to be transferred between EDA tool 110 and external devices. Examples of a communications interface 118 include, but are not limited to, a modem, an Ethernet card, a wireless network card, a Personal Computer Memory Card International Association ("PCMCIA") slot and card, or the like. Software and data transferred via communications interface 118 may be in the form of signals, which may be electronic, electromagnetic, optical, or the like that are capable of being received by communications interface 118. These signals may be provided to communications interface 118 via a communications path (e.g., a channel), which may be implemented using wire, cable, fiber optics, a telephone line, a cellular link, a radio frequency ("RF") link and other communication channels. The communications interface 118 may be a wired link and/or a wireless link coupled to a local area network (LAN) or a wide area network (WAN).

Router 120 is capable of receiving an identification of a plurality of cells to be included in a circuit layout, including a list 132 of pairs of cells, selected from the cell library 132 a, within the plurality of cells to be connected to each other. Design rules 134 may be used for a variety of processing technologies. In some embodiments, the design rules 134 configure the router 120 to locate connecting lines and vias on a manufacturing grid. Other embodiments may allow the router to include off-grid connecting lines and/or vias in the layout.

Figure 2:
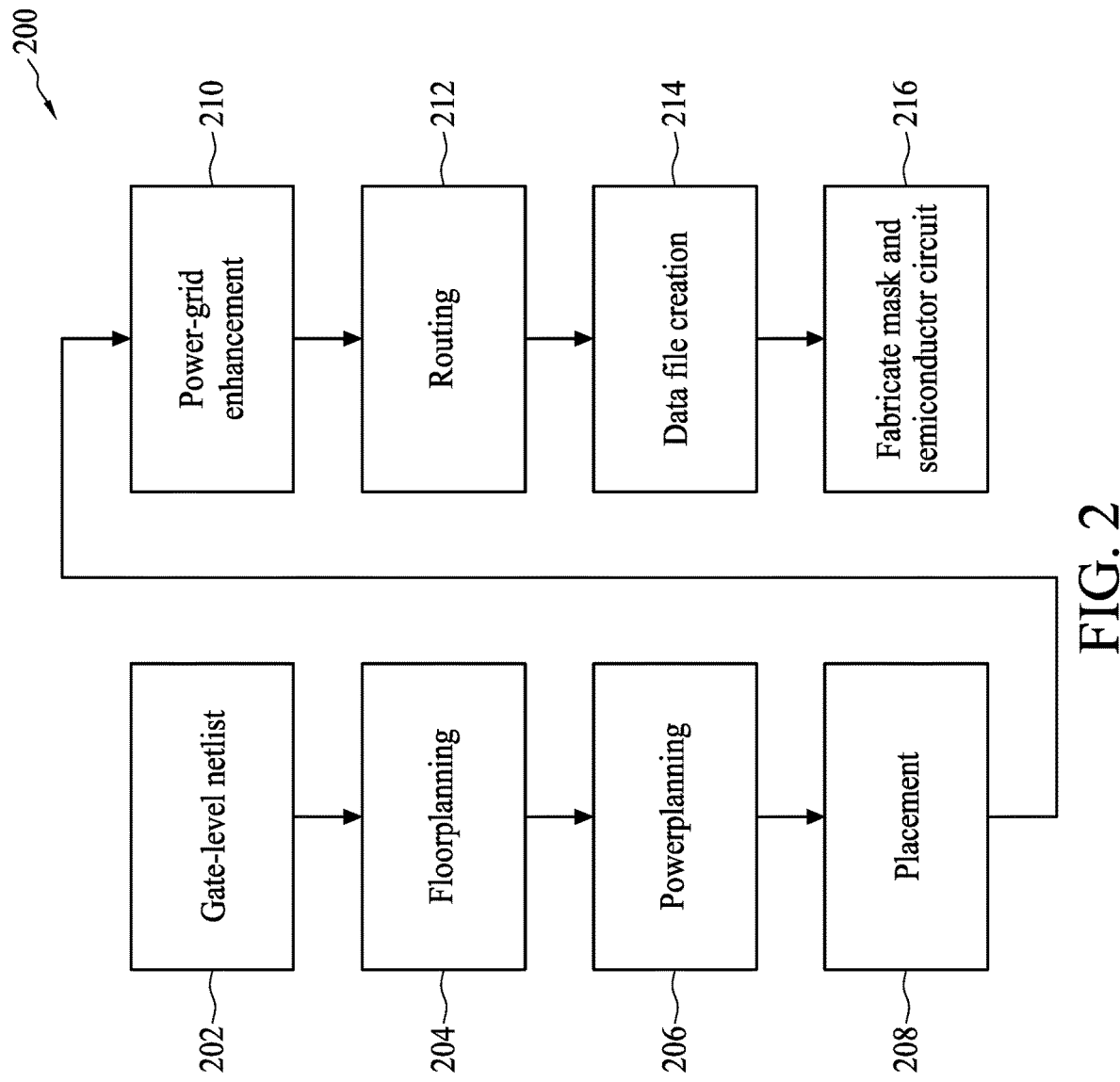
FIG. 2 is a flowchart illustrating a method of designing and fabricating a semiconductor-based circuit in accordance with some embodiments.

FIG. 2 illustrates one example of a method 200 of designing and fabricating a semiconductor-based circuit. In operation 202, a gate-level netlist is developed or extracted. As will be understood by one of ordinary skill in the art, the gate-level netlist can be extracted from circuit schematic by processor 114 of system 100.

In operation 204, floor planning for the semiconductor circuit is performed by system 100. In some embodiments, floor planning includes dividing a circuit into functional blocks, which are portions of the circuit, and identifying the layout for these functional blocks.

In operation 206, power planning for the semiconductor circuit is performed by system 100. Power planning includes identifying the power layout for the functional blocks of the semiconductor circuit. For example, the conductive traces for routing power and ground on the various conductive layers of the semiconductor circuit.

In operation 208, system 100 performs placement for the semiconductor circuit. According to some embodiments, the circuit placement includes determining the placement for the electronic components, circuitry, and logic elements. For example, the placement of the transistors, resistors, inductors, logic gates, and other elements of the semiconductor circuit are selected in operation 208.

In operation 210, system 100 performs power-grid enhancement.

In operation 212, the routings for the devices and semiconductor circuit are mapped. Routing in operation 212 is performed by router 120 of system 100.

In operation 214, a data file, such as a graphic database system ("GDS") II file, including data representing the physical layout of the circuit is generated and stored in a non-transient machine readable storage 140. As will be understood by one of ordinary skill in the art, the data file is used by mask making equipment, such as an optical pattern generator, to generate one or more masks for the circuit.

In operation 216, one or more masks for the semiconductor circuit are created based on the data file stored in operation 214. Once the physical design layout is generated, the physical design may be sent to a manufacturing tool to generate photolithographic masks that may be used for fabricating the semiconductor circuit. The physical design layout may be sent to the manufacturing tool through the LAN/WAN or other suitable forms of transmission from the EDA to the manufacturing tool.

According to some embodiments, the operations 208~212 may be an APR (Automatic Place and Route) process. During the APR process, a layout of the semiconductor circuit (i.e. integrated circuit, IC) is generated automatically by the APR process by using the plurality of proposed standard cells or logic cells. A logic cell may represent a single functional block of logic. A standard cell for example may represent a NAND gate, NOR gate, flip flop, AND gate, OR gate, XOR gate, XNOR gate, inverter, latch, or the like. The logic cell enables an integrated circuit designer to utilize a library of cells as reusable building blocks for an integrated circuit without the need to separately design each block of logic represented by a cell. The logic cells may be included in a library of cells for use by integrated circuit designers.

Figure 3:
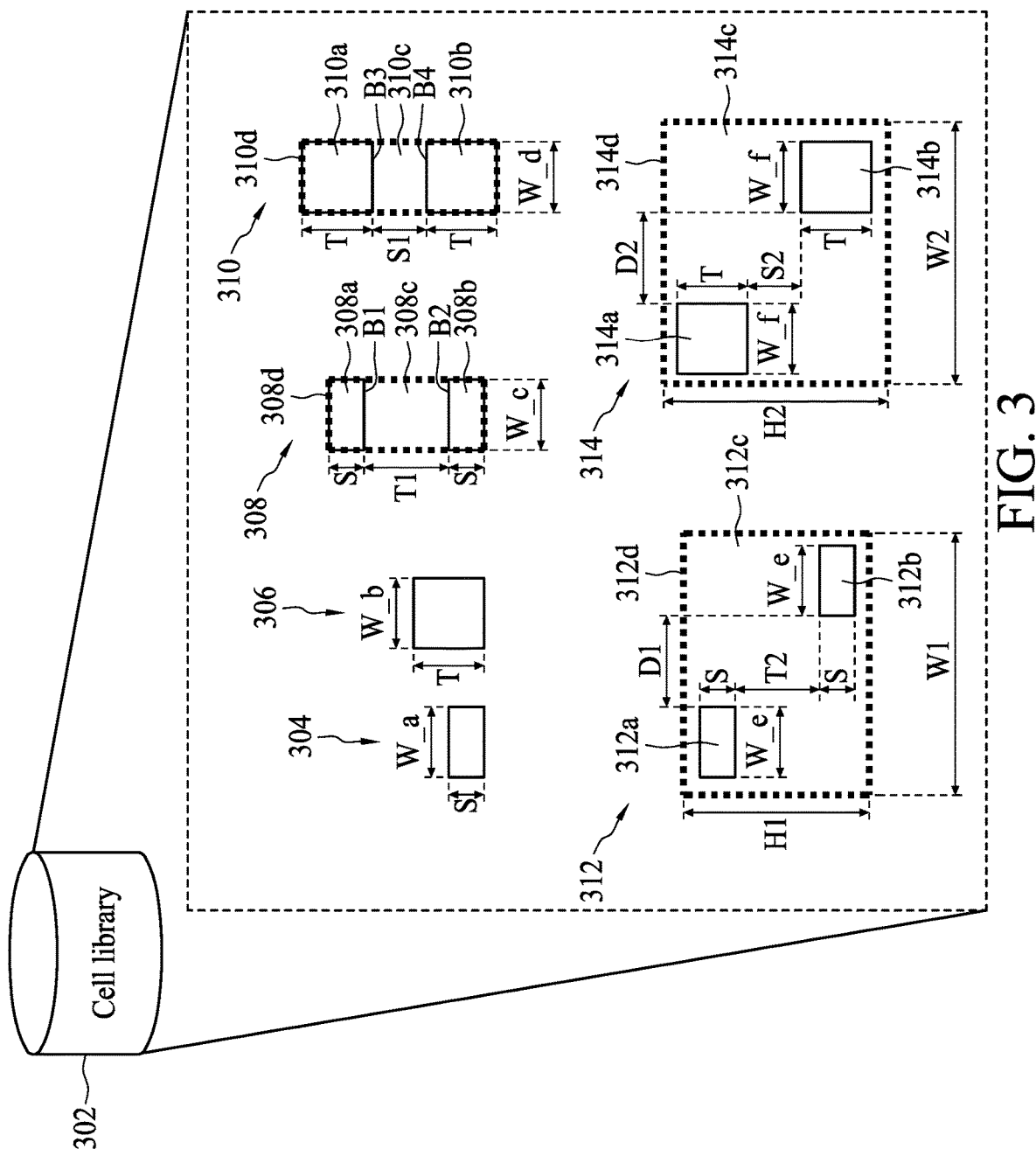
FIG. 3 is a diagram illustrating a cell library for storing logic cells in accordance with some embodiments.

FIG. 3 is a diagram illustrating a cell library 302 for storing logic cells in accordance with some embodiments. The cell library 302 may be a standard cell library. The logic cells may be standard cells, and the logic cells may be applied into cell rows of a layout of a semiconductor circuit during the operations 208~212 or the APR process. A logic cell is arranged to perform a specific logical function. For example, the specific logical function may be the operation of NAND, NOR, flip flop, AND, OR, XOR, XNOR, inverting, latching, or the like. The logic cells may have different cell structures. According to some embodiments, the logic cells may be implemented with a plurality of cell structures 304, 306, 308, 310, 312, and 314. It is noted that the present disclosure is not limited by those cell structures. The logic cells may be configured to have other type of cell structures.

According to some embodiments, the cell structure 304 may be a standard cell structure with a first cell height S. The cell structure 306 may be a second standard cell structure with a second cell height T. The cell height T is greater than the cell height S. The widths of the cell structure 304 and 306 are W_a and W_b respectively. According to some embodiments, the cell heights S and T may be constant heights and the widths W_a and W_b may be a variable width. However, this is not a limitation of the present disclosure. In another embodiment, the cell heights S and T may be variable heights and the widths W_a and W_b may be a constant width.

The cell structure 308 may be a third standard cell structure having a first portion 308*a* with the height S, a second portion 308*b* with the height S, and a third portion 308*c* with the height T1. The first portion 308*a* and the second portion 308*b* are separated by the third portion 308*c*. According to some embodiments, the upper boundary (i.e. B1) of the third portion 308*c* is abutted against a lower boundary of the first portion 308*a*, and a lower boundary (i.e. B2) of the third portion 308*c* is abutted against the upper boundary of the second portion 308*b*. The width of the cell structure 308 is W_c. The height T1 is substantially equal to the height T of the standard cell structure 306. The cell heights S and T1 may be constant heights and the width W_c may be a variable width. According to some embodiments, the first portion 308*a*, the second portion 308*b*, and the third portion 308c may be formed within a bounding box 308d of the cell structure 308. The width of the bounding box 308d is W_c, and the height of the bounding box 308d is the total of the heights (i.e. 2*S+T1) of the first portion 308a, the second portion 308b, and the third portion 308c. The first portion 308a, the second portion 308b, and the third portion 308c may be arranged to be a rectangular structure, and the rectangular structure may overlap with the bounding box 308d. According to some embodiments, the first portion 308a and the second portion 308b may comprise semiconductor elements or active devices, e.g. transistors, and the third portion 308c may comprise the interconnecting paths for coupling the semiconductor elements in the first portion 308a and the active devices in the second portion 308b. The semiconductor elements may be the front-end-of-line (FEOL) in the semiconductor device, and the interconnecting paths may be the back-end-of-line (BEOL) in the semiconductor device.

According to some embodiments, the height T1 of the third portion 308c may be greater than the height T. The height T1 may be a total of n*T and m*S, wherein n is an integer not less than 2, and m is an integer not less than 1. For example, the height T1 may be a total of 2*T and 1*S. In this example, the height T1 is substantially equal to a total of the heights T of two standard cell structure 306 and the height of one standard cell structure 304.

The cell structure 310 may be a fourth standard cell structure having a first portion 310a with the height T, a second portion 310b with the height T, and a third portion 310c with the height S1. The first portion 310a and the second portion 310b are separated by the third portion 310c. According to some embodiments, the upper boundary (i.e. B3) of the third portion 310c is abutted against a lower boundary of the first portion 310a, and a lower boundary (i.e. B4) of the third portion 310c is abutted against the upper boundary of the second portion 310b. The width of the cell structure 310 is W_d. The height S1 is substantially equal to the height S of the standard cell structure 304. The cell heights T and S1 may be constant heights and the width W_d may be a variable width. According to some embodiments, the first portion 310a, the second portion 310b, and the third portion 310c may be formed within a bounding box 310d of the cell structure 310. The width of the bounding box 310d is W_d, and the height of the bounding box 310d is the total of the heights (i.e. 2*T+S1) of the first portion 310a, the second portion 310b, and the third portion 310c. The first portion 310a, the second portion 310b, and the third portion 310c may be arranged to be a rectangular structure, and the rectangular structure may overlap with the bounding box 310d. According to some embodiments, the first portion 310a and the second portion 310b may comprise semiconductor elements, e.g. transistors, and the third portion 310c may comprise the interconnecting paths for coupling the semiconductor elements in the first portion 310a and the semiconductor elements in the second portion 310b.

According to some embodiments, the height S1 of the third portion 310c may be greater than the height S. The height S1 may be a total of n*S and m*T, wherein n is an integer not less than 2, and m is an integer not less than 1. For example, the height S1 may be a total of 2*S and 1*T. In this example, the height S1 is substantially equal to a total of the heights S of two standard cell structure 304 and the height of one standard cell structure 306.

The cell structure 312, which may be a rectilinear dual-driver cell structure, comprises a first portion 312a with the height S and the width W_e, a second portion 312b with the height S and the width W_e, and a third portion 312c. The width W_e of the first portion 312a may be different to the width W_e of the second portion 312b. A distance between the first portion 312a and the second portion 312b in vertical direction is T2. A distance between the first portion 312a and the second portion 312b in horizontal direction is D1. The distance T2 is substantially equal to the height T of the standard cell structure 306. The heights S and T2 may be constant heights and the widths W_e and D1 may be variable widths. According to some embodiments, the first portion 312a, the second portion 312b, and the third portion 312c may be formed within a bounding box 312d of the cell structure 312. The width of the bounding box 312d is W, and the height of the bounding box 312d is H1. According to some embodiments, the width W1 is not less than a total of the width W_e of the first portion 312a, the width W_e of the second portion 312b, and the distance D1. The height H1 is not less than a total of the height S of the first portion 312a, the height S of the second portion 312b, and the distance T2. According to some embodiments, the bounding box 312d has a rectangular boundary, and the first portion 312a and the second portion 312b may be located on the diagonal direction of the bounding box 312d. However, this is not a limitation of the present embodiments. The bounding box 312d may be a polygonal bounding box surrounding the first portion 312a, the second portion 312b, and the third portion 312c. According to some embodiments, the first portion 312a and the second portion 312b may comprise semiconductor elements, e.g. transistors, and the third portion 312c may comprise the interconnecting paths for connecting the semiconductor elements in the first portion 312a and the semiconductor elements in the second portion 312b.

According to some embodiments, the distance T2 may be greater than the height T. The distance T2 may be a total of n*T and m*S, wherein n is an integer not less than 2, and m is an integer not less than 1. For example, the distance T2 may be a total of 2*T and 1*S. In this example, the distance T2 is substantially equal to a total of the heights T of two standard cell structure 306 and the height of one standard cell structure 304.

The cell structure 314, which may be a rectilinear dual-driver cell structure, comprises a first portion 314a with the height T and the width W_f, a second portion 314b with the height T and the width W_f, and a third portion 314c. The width W_f of the first portion 314a may be different to the width W_f of the second portion 314b. A distance between the first portion 314a and the second portion 314b in vertical direction is S2. A distance between the first portion 314a and the second portion 314b in horizontal direction is D2. The distance S2 is substantially equal to the height S of the standard cell structure 304. The heights T and S2 may be constant heights and the widths W_f and D2 may be variable widths. According to some embodiments, the first portion 314a, the second portion 314b, and the third portion 314c may be formed within a bounding box 314d of the cell structure 314. The width of the bounding box 314d is W2, and the height of the bounding box 314d is H2. According to some embodiments, the width W2 is not less than a total of the width W_f of the first portion 314a, the width W_f of the second portion 314b, and the distance D2. The height H2 is not less than a total of the height T of the first portion 314a, the height T of the second portion 314b, and the distance S2. According to some embodiments, the bounding box 314d is a rectangular boundary, and the first portion 314a and the second portion 314b may be located on the diagonal direction of the bounding box 314d. However, this is not a limitation of the present embodiments. The bounding box 314d may be a polygonal bounding box surrounding the first portion 314a, the second portion 314b, and the third portion 314c. According to some embodiments, the first portion 314a and the second portion 314b may comprise semiconductor elements, e.g. transistors, and the third portion 314c may comprise the interconnecting paths for connecting the semiconductor elements in the first portion 314a and the semiconductor elements in the second portion 314b.

According to some embodiments, the distance S2 may be greater than the height S. The distance S2 may be a total of n*S and m*T, wherein n is an integer not less than 2, and m is an integer not less than 1. For example, the distance S2 may be a total of 2*S and 1*T. In this example, the distance S2 is substantially equal to a total of the heights S of two standard cell structure 304 and the height of one standard cell structure 306.

Figure 4:
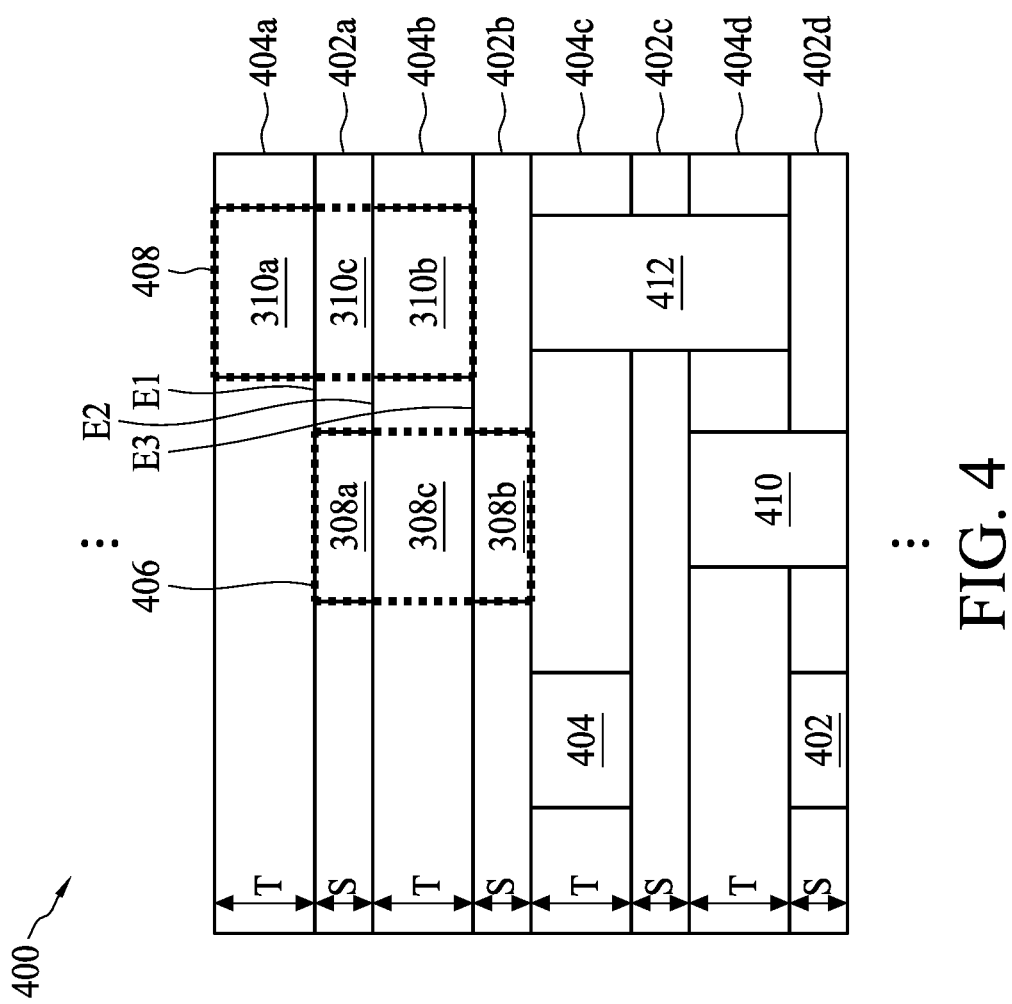
FIG. 4 is a diagram illustrating of a layout system of an integrated circuit in accordance with some embodiments.

FIG. 4 is a diagram illustrating of a layout system 400 of an integrated circuit (or a semiconductor device) in accordance with some embodiments. The layout system 400 may be a mixed-row heights layout system. The layout system 400 comprises a plurality of first-type doped rows 402a-402d with a first row height, i.e. S, for each row and a plurality of second-type doped rows 404a-404d with a second row height, i.e. T, for each row. The first-type doped rows 402a-402d are arranged to be interleaved with the second-type doped rows 404a-404d. For example, the upper edge (i.e. E1) of the first-type doped row 402a abuts against the lower edge of the second-type doped row 404a, the upper edge (i.e. E2) of the second-type doped row 404b abuts against the lower edge of the first-type doped row 402a, the upper edge (i.e. E3) of the first-type doped row 402b abuts against the lower edge of the second-type doped row 404b, and so on. Moreover, each of the first-type doped rows 402a-402d may comprise n-type well(s) and/or p-type substrate(s), and each of the second-type doped rows 404a-404d may comprise n-type well(s) and/or p-type substrate(s).

As the row height T of the second-type doped rows 404a-404d is greater than the row height S of the first-type doped rows 402a-404d, the second-type doped rows 404a-404d may be configured to have relatively high speed transistors (or semiconductor elements), and the first-type doped rows 402a-402d may be configured to have relatively low speed transistors.

According to some embodiments, a logic cell 402 with the cell structure 304 may be placed on the first-type doped rows 402d. A logic cell 404 with the cell structure 306 may be placed on the second-type doped rows 404c.

A logic cell 406 with the cell structure 308 may be placed on two first-type doped rows 402a, 402b, and one second-type doped row 404b. The first-type doped rows 402a, 402b, and the second-type doped row 404b may be three consecutive rows in the layout system 400. Specifically, the first portion 308a of the cell structure 308 may be disposed on the first-type doped row 402a, the second portion 308b of the cell structure 308 may be disposed on the other first-type doped row 402b, and the third portion 308c of the cell structure 308 may be disposed on the second-type doped row 404b. The cell structure 308 may be regarded as a jump-row cell structure, i.e. the first portion 308a and the second portion 308b jump over or bridge over the second-type doped row 404b. In the first-type doped rows 402a and 402b, the first portion 308a and the second portion 308b of the logic cell 406 are configured to have the relatively low transistors, and in the second-type doped row 404b, the third portion 308c of the logic cell 406 is configured to be the interconnecting paths between the relatively low transistors in the first portion 308a and the second portion 308b.

According to some embodiments, the third portion 308c is arranged to bridge over the second-type doped row 404b or the logic cell placed in the second-type doped row 404b.

A logic cell 408 with the cell structure 310 may be placed on two second-type doped rows 404a, 404b, and one first-type doped row 402a. The second-type doped rows 404a, 404b, and the first-type doped row 402a may be three consecutive rows in the layout system 400. Specifically, the first portion 310a of the cell structure 310 may be disposed on the second-type doped row 404a, the second portion 310b of the cell structure 310 may be disposed on the other second-type doped row 404b, and the third portion 310c of the cell structure 310 may be disposed on the first-type doped row 402a. The cell structure 310 may be regarded as a jump-row cell structure, i.e. the first portion 310a and the second portion 310b jump over or bridge over the first-type doped row 402a. In the second-type doped rows 404a and 404b, the first portion 310a and the second portion 310b of the logic cell 408 are configured to have the relatively high transistors, and in the first-type doped row 402a, the third portion 310c of the logic cell 408 is configured to be the interconnecting paths between the relatively high transistors in the first portion 310a and the second portion 310b. According to some embodiments, the third portion 310c is arranged to bridge over the first-type doped row 402a or the logic cell placed in the first-type doped row 402a.

In addition, a logic cell 410 with a cell structure crossing a first-type doped row 402d and a second-type doped row 404d and a logic cell 412 with a cell structure crossing a first-type doped row 402c and two second-type doped rows 404c and 404d may be placed on the layout system 400. The detailed description of the logic cells 410 and 412 is omitted here for brevity.

Figure 5:
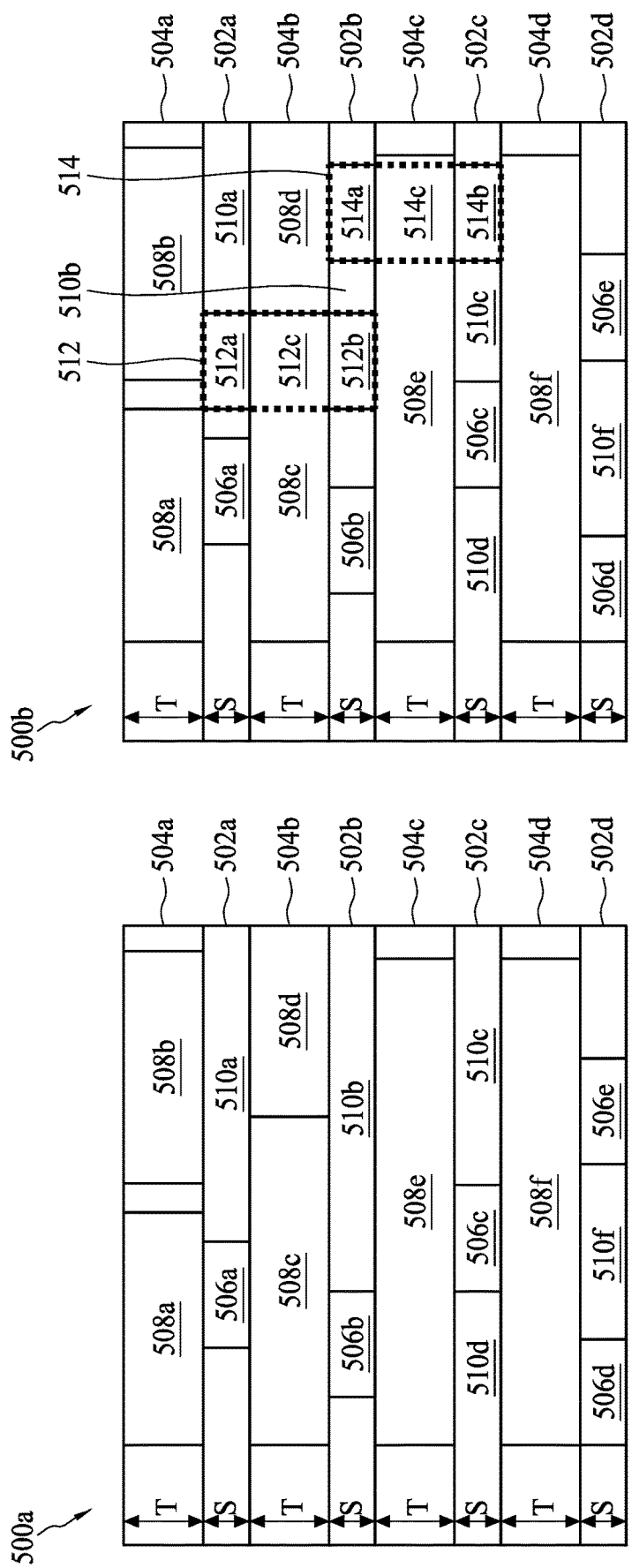
FIG. 5A is a diagram illustrating of a layout system of an integrated circuit in accordance with some embodiments.
FIG. 5B is a diagram illustrating of a layout system of an integrated circuit in accordance with some embodiments.

FIG. 5A is a diagram illustrating of a layout system 500a of an integrated circuit in accordance with some embodiments. FIG. 5B is a diagram illustrating of a layout system 500b of an integrated circuit in accordance with some embodiments. In FIG. 5A, the layout system 500a may be a mixed-row heights layout system. The layout system 500a comprises a plurality of first-type doped rows 502a-502d with the first row height S for each row and a plurality of second-type doped rows 504a-504d with the second row height T for each row.

According to some embodiments, a plurality of relatively low speed logic cells 506a-506e may be placed on the first-type doped rows 502a-502d respectively, and a plurality of relatively high speed logic cells 508a-508f may be placed on the second-type doped rows 504a-504d respectively. The number and the size of the logic cells 506a-506e may be different from the number and the size of the logic cells 508a-508f. Therefore, after the cell placement operation, the usage of the first-type doped rows 502a-502d and the second-type doped rows 504a-504d may be unbalanced. For example, the usage rate of the first-type doped rows 502a-502d may be 30% while the usage rate of the second-type doped rows 504a-504d may be 70%. The unused spaces, e.g. 510a-510c, in the first-type doped rows 502a-502d are wasted but the area is still counted for the layout system 500a. To increase the usage rate of the first-type doped rows 502a-502d, the logic cells with the cell structure 308 may be placed in the spaces 510a-510c of the first-type doped rows 502a-502d as shown in FIG. 5B.

In comparison to the layout system 500a, the layout system 500b in FIG. 5B further comprises a logic cells 512 and 514. The logic cell 512 is configured to be the cell structure 308, and the logic cell 512 comprises a first portion 512a, a second portion 512b, and a third portion 512c. The first portion 512a is disposed in the space 510a of the first-type doped row 502a, the second portion 512b is disposed in the space 510b of the first-type doped row 502b, and the third portion 512c is disposed in the second-type doped row 504b and is overlapped with a portion of the logic cell 508c. According to some embodiments, the third portion 512c is arranged to be the interconnecting paths of the first portion 512a and the second portion 512b and is formed in the BEOL of the semiconductor device, and the first portion 512a and the second portion 512b are arranged to be the semiconductor elements formed in the FEOL of the semiconductor device. Therefore, the third portion 512c may be arranged to overlap with a portion of the logic cell 508c viewing from the top of the semiconductor device.

In addition, the logic cell 514 is also configured to be the cell structure 308 comprising a first portion 514a, a second portion 514b, and a third portion 514c, wherein the first portion 514a is disposed in the space 510b of the first-type doped row 502b, the second portion 514b is disposed in the space 510c of the first-type doped row 502c, and the third portion 514c is disposed in the second-type doped row 504c and is overlapped with a portion of the logic cell 508e. The third portion 514c is arranged to be the interconnecting paths of the first portion 514a and the second portion 514b and is formed in the BEOL of the semiconductor device, and the first portion 514a and the second portion 514b are arranged to be the semiconductor elements formed in the FEOL of the semiconductor device. Therefore, the third portion 514c may be arranged to overlap with a portion of the logic cell 508e viewing from the top of the semiconductor device.

Accordingly, the spaces 510a-510c in the first-type doped rows 502a-502d may be reused by the logic cells 512 and 514 with the cell structure 308 such that the usage rate of the first-type doped rows 502a-502d in the layout system 500b may be increased. Moreover, when the active devices, e.g. transistors, in the first portion 512a and the second portion 512b of the logic cell 512 are placed in the same type of doped rows (i.e. the first-type doped rows 502a and 502b), the transistors in the first portion 512a and the transistors in the second portion 512b may have equal speed such that the signal delay of the logic cell 512 (as well as the circuit 514) may be balanced and optimized.

Figure 6:
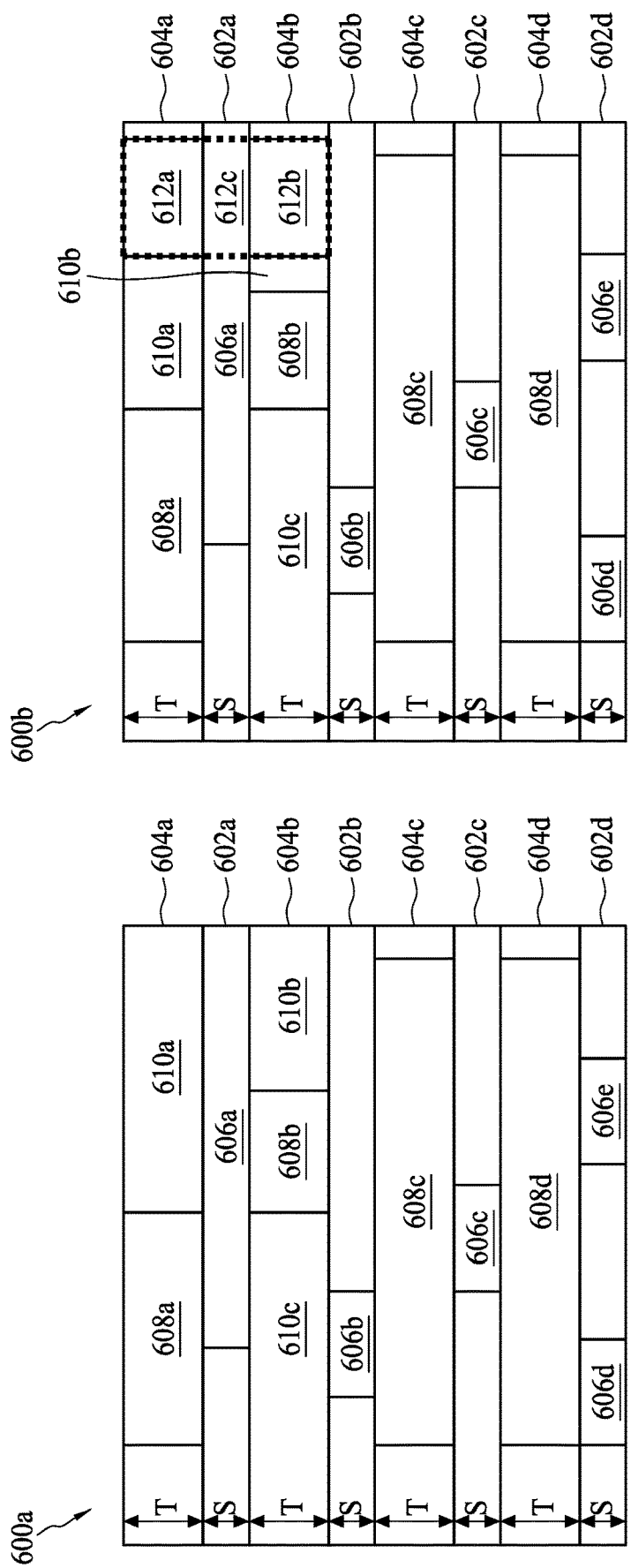
FIG. 6A is a diagram illustrating of a layout system of an integrated circuit in accordance with some embodiments.
FIG. 6B is a diagram illustrating of a layout system of an integrated circuit in accordance with some embodiments.

FIG. 6A is a diagram illustrating of a layout system 600a of an integrated circuit in accordance with some embodiments. FIG. 6B is a diagram illustrating of a layout system 600b of an integrated circuit in accordance with some embodiments. The layout system 600a comprises a plurality of first-type doped rows 602a-602d with the first row height S for each row and a plurality of second-type doped rows 604a-604d with the second row height T for each row.

According to some embodiments, a plurality of relatively low speed logic cells 606a-606e may be placed on the first-type doped rows 602a-602d respectively, and a plurality of relatively high speed logic cells 608a-608d may be placed on the second-type doped rows 604a-604d respectively. After the cell placement operation, the usage of the first-type doped rows 602a-602d and the second-type doped rows 604a-604d may be unbalanced. For example, the unused spaces, e.g. 610a-610b, in the second-type doped rows 604a-604b are wasted but the area is still counted for the layout system 600a. To increase the usage rate of the second-type doped rows 604a-604d, the logic cells with the cell structure 310 may be placed in the spaces 610a-610b of the second-type doped rows 604a-604b as shown in FIG. 6B.

In comparison to the layout system 600a, the layout system 600b in FIG. 6B further comprises a logic cell 612.

The logic cell 612 is configured to be the cell structure 310, and the logic cell 612 comprises a first portion 612a, a second portion 612b, and a third portion 612c. The first portion 612a is disposed in the space 610a of the second-type doped row 604a, the second portion 612b is disposed in the space 610b of the second-type doped row 604b, and the third portion 612c is disposed in the first-type doped row 602a and is overlapped with a portion of the logic cell 606a. According to some embodiments, the third portion 612c is arranged to be the interconnecting paths of the first portion 612a and the second portion 612b and is formed in the BEOL of the semiconductor device, and the logic cell 606a and the second portion 612b are arranged to be the semiconductor elements formed in the FEOL of the semiconductor device. Therefore, the third portion 612c may be arranged to overlap with a portion of the logic cell 606a viewing from the top of the semiconductor device.

Accordingly, the spaces 610a-610b in the second-type doped rows 604a-604b may be reused by the logic cell 612 with the cell structure 310 such that the usage rate of the second-type doped rows 604a-604d in the layout system 600b may be increased. Moreover, when the active devices, e.g. transistors, in the first portion 612a and the second portion 612b of the logic cell 612 are placed in the same type of doped rows (i.e. the second-type doped rows 604a and 604b), the transistors in the first portion 612a and the transistors in the second portion 612b may have equal speed such that the signal delay of the logic cell 612 may be balanced and optimized.

Figure 7:
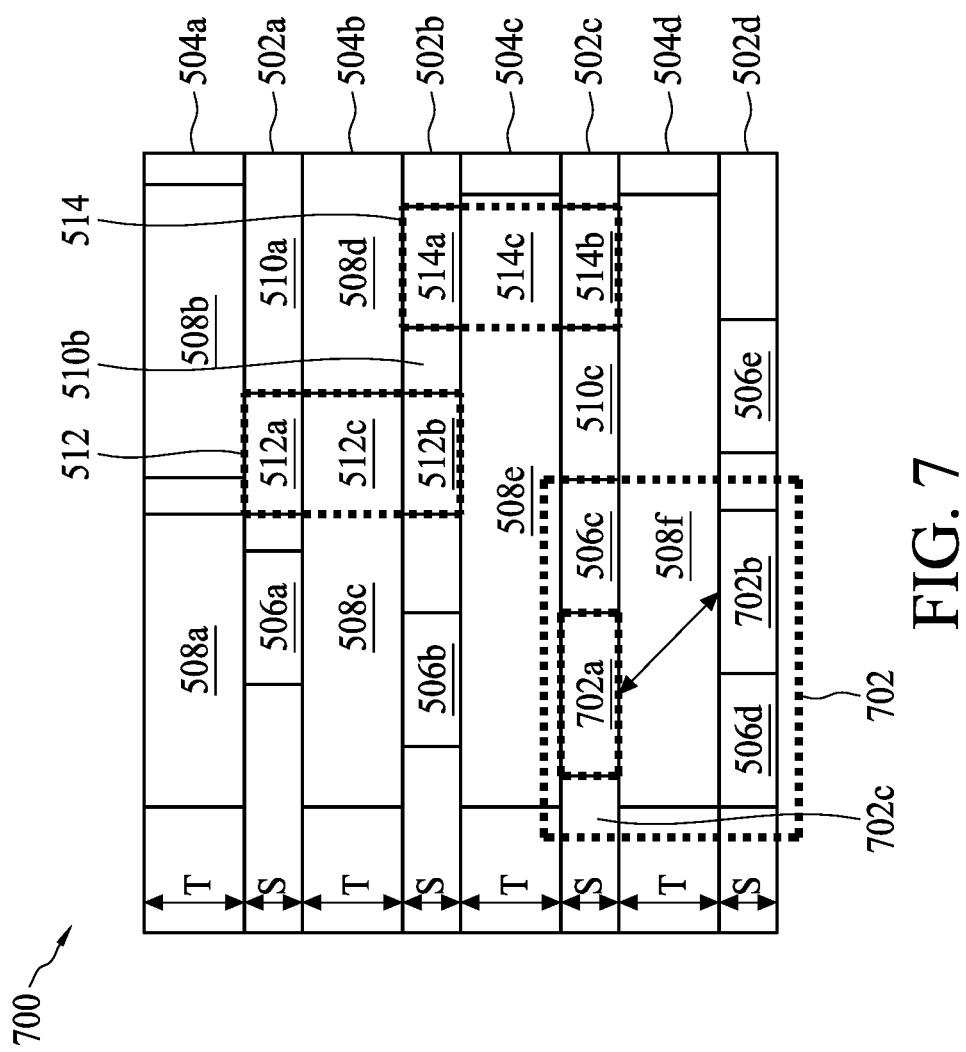
FIG. 7 is a diagram illustrating of a layout system of an integrated circuit in accordance with some embodiments.

FIG. 7 is a diagram illustrating of a layout system 700 of an integrated circuit in accordance with some embodiments. For brevity, the numerals of elements in the layout system 700 are similar to the numerals of elements in the layout system 500b.

In comparison to the layout system 500b, the layout system 700 in FIG. 7 further comprises a logic cell 702. The logic cell 702 is configured to be the cell structure 312, and the logic cell 702 comprises a first portion 702a, a second portion 702b, and a third portion 702c. The first portion 702a is disposed in the space 510d of the first-type doped row 502c, the second portion 702b is disposed in the space 510f of the first-type doped row 502d, and the third portion 702c is disposed in a portion of the second-type doped row 504c, the first-type doped row 502c, the second-type doped row 504d, and the first-type doped row 502d. The space 510d and the space 510f are rectilinear spaces. According to some embodiments, the third portion 702c is arranged to be the interconnecting paths of the first portion 702a and the second portion 702b and is formed in the BEOL of the semiconductor device, and the logic cell 508e, the logic cell 506c, the logic cell 508f, and the logic cell 506d are arranged to be the semiconductor elements formed in the FEOL of the semiconductor device. Therefore, the third portion 702c are formed above a portion of the logic cell 508e, the logic cell 506c, a portion of the logic cell 508f, and the logic cell 506d, and may be overlapped with the portion of the logic cell 508e, the logic cell 506c, the portion of the logic cell 508f, and the logic cell 506d viewing from the top of the semiconductor device.

Accordingly, the spaces 510d-510f in the first-type doped rows 502c-502d may be reused by the logic cell 702 with the cell structure 312 such that the usage rate of the first-type doped rows 502a-502d in the layout system 700 may be increased. Moreover, the resource of the layout system 700 may be increased by placing the rectilinear cell structures 312 into the rectilinear space fragments.

Figure 8:
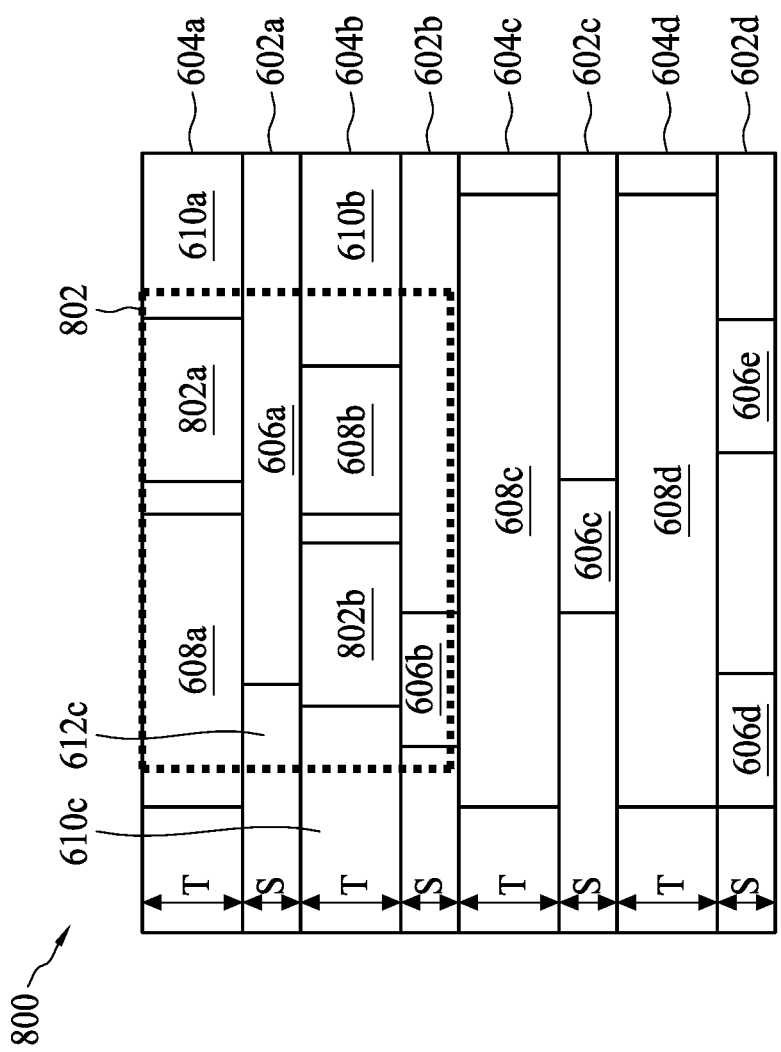
FIG. 8 is a diagram illustrating of a layout system of an integrated circuit in accordance with some embodiments.

FIG. 8 is a diagram illustrating of a layout system 800 of an integrated circuit in accordance with some embodiments. For brevity, the numerals of elements in the layout system 800 are similar to the numerals of elements in the layout system 600a.

In comparison to the layout system 600a, the layout system 800 in FIG. 8 further comprises a logic cell 802. The logic cell 802 is configured to be the cell structure 314, and the logic cell 802 comprises a first portion 802a, a second portion 802b, and a third portion 802c. The first portion 802a is disposed in the space 610a of the second-type doped row 604a, the second portion 802b is disposed in the space 610c of the second-type doped row 604b, and the third portion 802c is disposed in the second-type doped row 604a, the first-type doped row 602a, the second-type doped row 604b, and a portion of the first-type doped row 602b. The space 610a and the space 610c are rectilinear spaces. According to some embodiments, the third portion 802c is arranged to be the interconnecting paths of the first portion 802a and the second portion 802b and is formed in the BEOL of the semiconductor device, and the logic cell 608a, the logic cell 606a, the logic cell 608b, and the logic cell 606b are arranged to be the semiconductor elements formed in the FEOL of the semiconductor device. Therefore, the third portion 802c are formed above a portion of the logic cell 608a, a portion of the logic cell 606a, the logic cell 608b, and a portion of the logic cell 606b, and may be overlapped with the portion of the logic cell 608a, the portion of the logic cell 606a, the logic cell 608b, and the portion of the logic cell 606b viewing from the top of the semiconductor device.

Accordingly, the spaces 610a and 610c in the second-type doped rows 604a-604b may be reused by the logic cell 802 with the cell structure 314 such that the usage rate of the second-type doped rows 604a-604d in the layout system 800 may be increased. Moreover, the resource of the layout system 800 may be increased by placing the rectilinear cell structures 314 into the rectilinear space fragments.

FIG. 9A is a diagram illustrating of a logic cell 902 placed in a mixed-row heights layout system 900 in accordance with some embodiments. The logic cell 902 is configured to be the cell structure 306 and is placed on the second-type doped row 904 in the mixed-row heights layout system 900. During the cell placement operation, the cell structure of the logic cell 902 may be replaced with a logic cell 910 with the cell structure 308 or a logic cell 912 with the cell structure 312 from the cell structure 306 to increase the usage of the first-type doped rows 906 and 908. FIG. 9B is a diagram illustrating of the logic cell 910 placed in the mixed-row heights layout system 900 in accordance with some embodiments. When the logic cell 902 is replaced with the logic cell 910, the logic cell 902 may be re-configured into two portions, i.e. 910a and 910b. The two portions 910a and 910b may be placed in the first-type doped rows 906 and 908 respectively. The logic cell 910 is similar to the above mentioned logic cell 702, thus the detailed description of the logic cell 910 is omitted here for brevity.

FIG. 9C is a diagram illustrating of the logic cell 912 placed in the mixed-row heights layout system 900 in accordance with some embodiments. When the logic cell 902 is replaced with the logic cell 912, the logic cell 902 may be re-configured into two portions, i.e. 912a and 912b. The two portions 912a and 912b may be placed in the first-type doped rows 906 and 908 respectively. The logic cell 912 is similar to the above mentioned logic cell 512 or 514, thus the detailed description of the logic cell 912 is omitted here for brevity.

FIG. 9D is a diagram illustrating a schematic circuit of the logic cell 902 in accordance with some embodiments. The schematic circuit of the logic cell 902 may comprise an AND gate (or NAND gate) having two input terminals Ni1 and Ni2 and an output terminal No. When the logic cell 902 is re-configured into the logic cell 910 or 912, the schematic circuit of the logic cell 902 may be re-configured into the schematic circuit as shown in FIG. 9E. FIG. 9E is a diagram illustrating a schematic circuit of the logic cell 910 (or 912) in accordance with some embodiments. The schematic circuit of the logic cell 910 comprises two AND gates AND1 and AND2. In other words, the logic cell 902 is re-configured into dual-driver cells. The first input terminal of the AND gate AND1 and the first input terminal of the AND gate AND2 are coupled to the input terminal Ni1, the second input terminal of the AND gate AND1 and the second input terminal of the AND gate AND2 are coupled to the input terminal Ni2, and the output terminal of the AND gate AND1 and the output terminal of the AND gate AND2 are coupled to the output terminal No. The logical function of the logic cell 910 is similar to the logical function of the logic cell 902. However, due to the dual-driver structure, the routing paths of the logic cell 910 may greater than the routing paths of the logic cell 902. According to some embodiments, the first portion 910a and the second portion 910b may be the layout cell of the AND gate AND1 and the AND gate AND2 respectively. The third portion 910c may be the layout portion of the interconnecting paths between the AND gate AND1 and the AND gate AND2.

Figure 10:
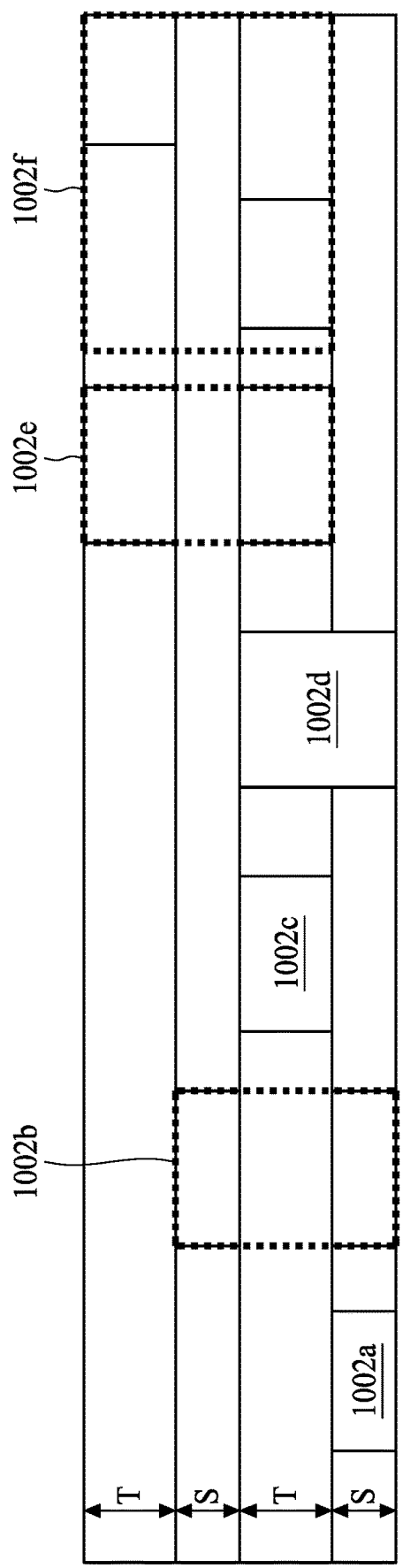
FIG. 10 is a diagram illustrating a plurality of cell structures of a logic cell in accordance with some embodiments.

FIG. 10 is a diagram illustrating a plurality of cell structures 1002a, 1002b, 1002c, 1002d, 1002e, and 1002f of a logic cell (e.g. a NAND gate) in accordance with some embodiments. The cell structures 1002a may be the cell structure 304. The cell structures 1002b may be the cell structure 308. The cell structures 1002c may be the cell structure 306. The cell structures 1002d may be a cell structure having a first portion disposed in the first-type doped row and a second portion disposed in the second-type doped row. The cell structures 1002e may be the cell structure 310. The cell structures 1002f may be the cell structure 314 (or 312). According to some embodiments, the NAND gate with the cell structure 1002a may have the largest signal delay, and the NAND gate with the cell structure 1002e may have the smallest signal delay. In other words, the NAND gate with the cell structure 1002a may have the lowest operating speed, and the NAND gate with the cell structure 1002e may have the highest operating speed. The signal delay of the NAND gate with the cell structure 1002b may be closed to the signal delay of the NAND gate with the cell structure 1002c. The signal delay of the NAND gate with the cell structure 1002f may be slightly smaller than the signal delay of the NAND gate with the cell structure 1002e. For example, when the signal delays of the cell structures 1002a, 1002b, 1002c, 1002d, 1002e, and 1002f of the NAND gates are T1, T2, T3, T4, T5, and T6 respectively, the relationship of the signal delays T1, T2, T3, T4, T5, and T6 may be expressed as below:

$$T1>T2 \approx T3>T4>T6>T5$$

In addition, for the NAND gates with the cell structures 1002b, 1002e, and 1002f, the interconnecting paths or the post-connection wires used for connecting the different portions of the cell structure may cost additional area for the cell structure. For example, when the areas of the cell structures 1002a, 1002b, 1002c, 1002d, 1002e, and 1002f of the NAND gates are A1, A2, A3, A4, A5, and A6 respectively, the relationship of the areas A1, A2, A3, A4, A5, and A6 may be expressed as below:

A6>A5>A4>A2>A3>A1

Figure 11:
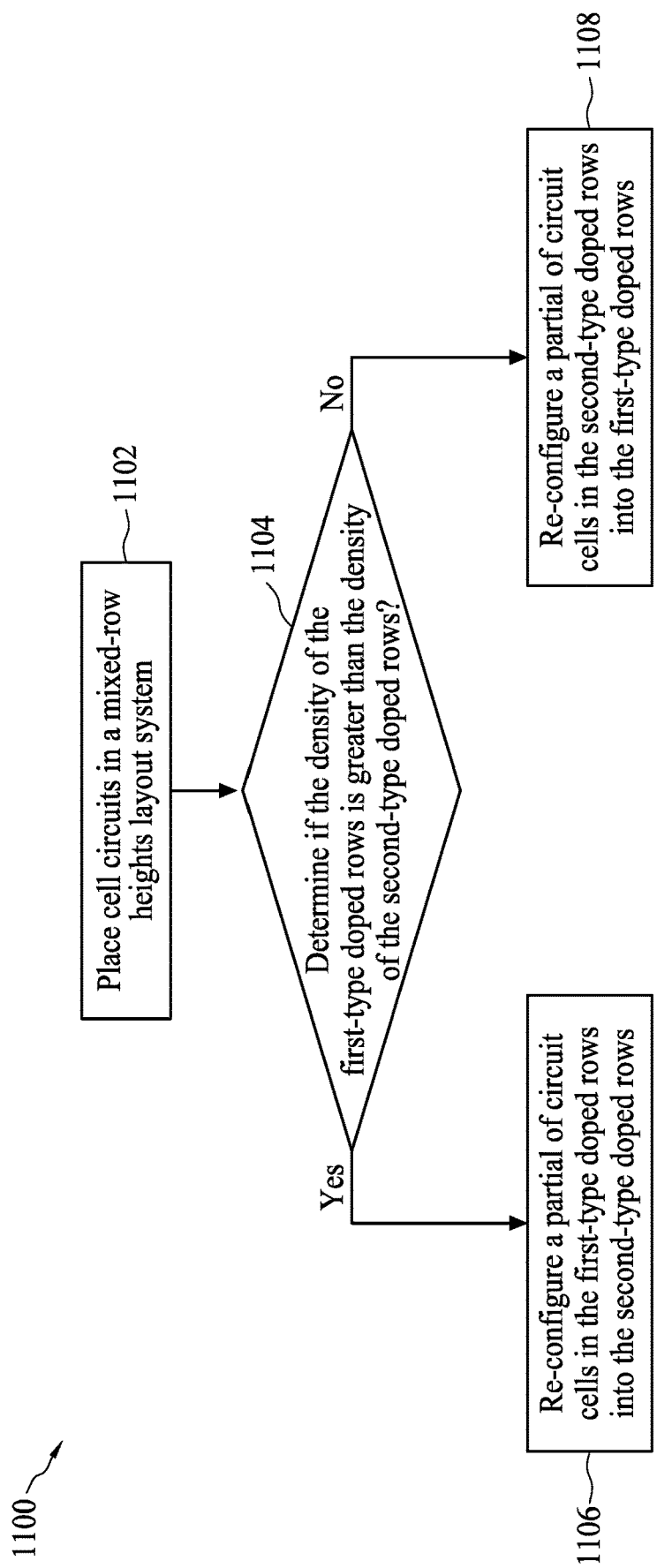
FIG. 11 is a flowchart illustrating a placement method in accordance with some embodiments.

FIG. 11 is a flowchart illustrating a placement method 1100 in accordance with some embodiments. The placement method 1100 may balance the placement density of a mixed-row heights layout system of an integrated circuit. The placement method 1100 comprises operations 1102-1108. Provided that substantially the same result is achieved, the operations of the flowchart shown in FIG. 11 may not follow the same order and may not be contiguous. In some embodiments, other intermediate operations may be included.

In operation 1102, a plurality of cell circuits with a plurality of cell structures are placed in the mixed-row heights layout system (e.g. 500a) having a plurality of first-type doped rows interleaved with a plurality of second-type doped rows. The plurality of cell structures may be the above mentioned cell structures 304, 306, 412, and 1002d.

In operation 1104, a measuring operation is performed upon the mixed-row heights layout system to determine if the density of the first-type doped rows is greater than the density of the second-type doped rows in the mixed-row heights layout system. If the density of the first-type doped rows is greater than the density of the second-type doped rows, goes to operation 1106. If the density of the second-type doped rows is greater than the density of the first-type doped rows, goes to operation 1108.

In operation 1106, a first adjusting operation is performed upon the mixed-row heights layout system. During the first adjusting operation, a number or a partial of the logic cells with the cell structure 304 are re-configured into the cell structure 306, 310, and/or 314. For example, when the usage rate of the first-type doped rows is 80% and the usage rate of the second-type doped rows is 20%, the first adjusting operation may change 30% of the logic cells (e.g. the logic cells with the cell structure 304) in the first-type doped rows into the second-type doped rows (e.g. the logic cells with the cell structures 306, 310, and/or 314). After the first adjusting operation, the speed of the re-configured logic cells is increased, and the overall performance of the semiconductor device is upgraded. The balancing of the usage of the first-type doped rows and the second-type doped rows is also improved.

In operation 1108, a second adjusting operation is performed upon the mixed-row heights layout system. During the second adjusting operation, a number or a partial of the logic cells with the cell structure 306 are re-configured into the cell structure 304, 308, and/or 312. For example, when the usage rate of the second-type doped rows is 80% and the usage rate of the first-type doped rows is 20%, the second adjusting operation may change 30% of the logic cells (e.g. the logic cells with the cell structure 306) in the second-type doped rows into the first-type doped rows (e.g. the logic cells with the cell structures 304, 308, and/or 312).

For another example, in operation 1108, when the usage rate of the second-type doped rows is 80% and the usage rate of the first-type doped rows is 20%, the second adjusting operation may change 20% of the logic cells (e.g. the logic cells with the cell structure 306) in the second-type doped rows into the logic cells with the cell structure 308. After the second adjusting operation, the usage rate of the second-type doped rows is changed to 60% from 80% and the usage rate of the first-type doped rows is changed to 40% from 20%. Accordingly, the balancing of the usage of the first-type doped rows and the second-type doped rows is improved.

Briefly, the proposed embodiment provides jump-row cell structures and rectilinear cell structures for the multi-height layout system to increase and to balance the usage density and the placement flexibility of the multi-height layout system. The resource of the multi-height layout system may be increased by placing the rectilinear cell structures into the rectilinear space fragments. Moreover, the jump-row logic cell structures may provide transistors with equal speed such that the signal delay of the cell may be balanced and optimized.

In some embodiments, the present disclosure provides a logic cell structure embodied on a non-transitory computer-readable medium. The logic cell structure comprises a first portion, a second portion, and a third portion. The first portion is arranged to be a first layout of a first semiconductor element. The logic cell structure is formed on a substrate area. As viewed from a top of the substrate area, the first portion is placed in a first cell row of the substrate area, the first cell row extends in a first direction, and the first portion has a first height in a second direction vertical to the first direction. The second portion is arranged to be a second layout of a second semiconductor element. As viewed from the top of the substrate area, the second portion is placed in a second cell row of the substrate area and has the first height in the second direction, and the first portion is separated from the second portion. The third portion is arranged to be a third layout of an interconnecting path used for coupling the first semiconductor element and the second semiconductor element. As viewed from the top of the substrate area, the third portion is placed within the substrate area, and the first portion, the second portion, and the third portion are bounded by a bounding box with a height in the second direction and a width in the first direction. A center of the first portion and a center of the second portion are arranged in a third direction different from each of the first direction and the second direction.

In some embodiments, the present disclosure provides an integrated circuit. The integrated circuit comprises a substrate area, a first logic cell and a second logic cell. The substrate area comprises a plurality of first-type doped rows and a plurality of second-type doped rows. As viewed from a top of the substrate area, each of the first-type doped rows extends in a first direction, and has a first height in a second direction vertical to the first direction. The second-type doped rows are interleaved with the first-type doped rows. As viewed from the top of the substrate area, each of the second-type doped rows extends in the first direction, and has a second height in the second direction. The first logic cell, formed on the substrate area, comprises a first portion, a second portion and a third portion. As viewed from the top of the substrate area, the first portion has the first height in the second direction and placed in one of the first-type doped rows, the second portion is placed in one of the second-type doped rows disposed at one side of the one of the first-type doped rows, and the third portion is placed in another of the second-type doped rows disposed at another side of the one of the first-type doped rows. As viewed from the top of the substrate area, at least a portion of the second logic cell is placed in one of the one of the first-type rows and the one of the second-type doped rows.

In some embodiments, the present disclosure provides an integrated circuit. The integrated circuit comprises a substrate area and a logic cell. The substrate area comprises a plurality of first-type doped rows and a plurality of second-type doped rows. As viewed from a top of the substrate area, each of the first-type doped rows extends in a first direction, and has a first height in a second direction vertical to the first direction. The second-type doped rows are interleaved with the first-type doped rows. As viewed from the top of the substrate area, each of the second-type doped rows extends in the first direction, and has a second height in the second direction. The logic cell, formed on the substrate area, comprises a first portion, a second portion and a third portion. As viewed from the top of the substrate area, each of the first portion and the second portion has the first height in the second direction, the first portion is placed in one of the first-type doped rows, the second portion is placed in another of the first-type doped rows, and the third portion is overlapped with two of the second-type doped rows, disposed at opposite sides of the one of the first-type doped rows respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A logic cell structure embodied on a non-transitory computer-readable medium, the logic cell structure comprising:
   a first portion arranged to be a first layout of a first semiconductor element, the first semiconductor element being arranged to perform a first logical function, wherein the logic cell structure is formed on a substrate area; as viewed from a top of the substrate area, the first portion is placed in a first cell row of the substrate area, the first cell row extends in a first direction, and the first portion has a first height in a second direction vertical to the first direction;
   a second portion arranged to be a second layout of a second semiconductor element, the second semiconductor element being arranged to perform a second logical function identical to the first logical function, wherein as viewed from the top of the substrate area, the second portion is placed in a second cell row of the substrate area and has the first height in the second direction; and
   a third portion, arranged to be a third layout of an interconnecting path used for coupling the first semiconductor element and the second semiconductor element, wherein as viewed from the top of the substrate area, the third portion is placed within the substrate area, the first portion placed in the first cell row and the second portion placed in the second cell row are separated by a third cell row located between and arranged in parallel to the first cell row and the second cell row, and are interconnected by a part of the third portion placed in the third cell row, and the first portion, the second portion and the third portion are bounded by a bounding box with a height in the second direction and a width in the first direction; a center of the first portion and a center of the second portion are arranged in a third direction different from each of the first direction and the second direction; the third portion is arranged to couple an input node of the first portion to an input node of the second portion, and couple an output node of the first portion to an output node of the second portion.

2. The logic cell structure of claim 1, wherein the third direction is a diagonal direction of the bounding box.

3. The logic cell structure of claim 1, wherein the third portion has a second height in the second direction, and the second height is different from the first height.

4. The logic cell structure of claim 1, wherein the third portion has the first height in the second direction.

5. The logic cell structure of claim 1, wherein an operating speed of a transistor included in the first semiconductor element formed according to the first portion is equal to an operating speed of a transistor included in the second semiconductor element formed according to the second portion.

6. The logic cell structure of claim 1, wherein the first portion and the second portion are located at opposite sides of the third portion in the second direction; the height of the bounding box is equal to or greater than a total of the first height of the first portion, the first height of the second portion, and a distance between the first portion and the second portion in the second direction.

7. The logic cell structure of claim 1, wherein the first portion and the second portion are located at opposite sides of the third portion in the second direction; the width of the bounding box is equal to or greater than a total of a first width of the first portion, a second width of the second portion, and a distance between the first portion and the second portion in the first direction.

8. An integrated circuit, comprising:
   a substrate area, comprising:
      a plurality of first-type doped rows, wherein as viewed from a top of the substrate area, each of the first-type doped rows extends in a first direction, and has a first height in a second direction vertical to the first direction; and
      a plurality of second-type doped rows, interleaved with the first-type doped rows, wherein as viewed from the top of the substrate area, each of the second-type doped rows extends in the first direction, and has a second height in the second direction;
   a first logic cell, formed on the substrate area, the first logic cell comprising:
      a first portion, a second portion and a third portion, wherein as viewed from the top of the substrate area, the first portion has the first height in the second direction and placed in one of the first-type doped rows, the second portion is placed in one of the second-type doped rows disposed at one side of the one of the first-type doped rows, and the third portion is placed in another of the second-type doped rows disposed at another side of the one of the first-type doped rows; and
   a second logic cell, wherein as viewed from the top of the substrate area, at least a portion of the second logic cell is placed in one of the one of the first-type rows and the one of the second-type doped rows.

9. The integrated circuit of claim 8, wherein another portion of the second logic cell is placed in the other of the one of the first-type rows and the one of the second-type doped rows.

10. The integrated circuit of claim 8, wherein another portion of the second logic cell is placed in another of the first-type doped rows.

11. The integrated circuit of claim 8, wherein the second height is different from the first height.

12. The integrated circuit of claim 8, wherein the second height is equal to the first height.

13. The integrated circuit of claim 8, wherein a center of the first portion and a center of the second portion are arranged in a third direction different from each of the first direction and the second direction.

14. The integrated circuit of claim 8, wherein as viewed from the top of the substrate area, the portion of the second logic cell is overlapped with one of the first portion and the second portion.

15. An integrated circuit, comprising:
a substrate area, comprising:
a plurality of first-type doped rows, wherein as viewed from a top of the substrate area, each of the first-type doped rows extends in a first direction, and has a first height in a second direction vertical to the first direction; and
a plurality of second-type doped rows, interleaved with the first-type doped rows, wherein as viewed from the top of the substrate area, each of the second-type doped rows extends in the first direction, and has a second height in the second direction; and
a logic cell, formed on the substrate area, the logic cell comprising:
a first portion, a second portion and a third portion, wherein as viewed from the top of the substrate area, each of the first portion and the second portion has the first height in the second direction, the first portion is placed in one of the first-type doped rows, the second portion is placed in another of the first-type doped rows, and the third portion is overlapped with two of the second-type doped rows, disposed at opposite sides of the one of the first-type doped rows respectively.

16. The integrated circuit of claim 15, wherein the third portion is further overlapped with the one of the first-type doped rows.

17. The integrated circuit of claim 15, wherein the third portion is further overlapped with the another of the first-type doped rows.

18. The integrated circuit of claim 15, wherein a center of the first portion and a center of the second portion are arranged in a third direction different from each of the first direction and the second direction.

19. The integrated circuit of claim 15, wherein the second height is different from the first height.

20. The integrated circuit of claim 15, wherein the second height is equal to the first height.

* * * * *